United States Patent [19]

Stoeckert et al.

[11] 3,860,949

[45] Jan. 14, 1975

[54] SEMICONDUCTOR MOUNTING DEVICES MADE BY SOLDERING FLAT SURFACES TO EACH OTHER

[75] Inventors: Alvin John Stoeckert, Sommerville; James Martin Hunt, Belle Mead, both of N.J.

[73] Assignee: RCA Corporation, New York, N.Y.

[22] Filed: Sept. 12, 1973

[21] Appl. No.: 396,565

[52] U.S. Cl. ........................ 357/65, 357/71, 357/67, 357/81, 29/589

[51] Int. Cl. ............................ H01l 3/00, H01l 5/00

[58] Field of Search .................... 317/234, 1, 5.3, 6; 29/589

[56] References Cited

UNITED STATES PATENTS

| | | | |
|---|---|---|---|
| 3,311,798 | 3/1967 | Gray | 317/234 A |
| 3,387,191 | 6/1968 | Fishman et al. | 317/234 A |
| 3,706,915 | 12/1972 | Lootens et al. | 317/234 A |
| 3,743,895 | 7/1973 | Klunker et al. | 317/234 L |

FOREIGN PATENTS OR APPLICATIONS

| | | | |
|---|---|---|---|
| 803,295 | 10/1958 | Great Britain | 317/234 P |

*Primary Examiner*—Andrew J. James
*Attorney, Agent, or Firm*—H. Christoffersen; Arthur I. Spechler

[57] ABSTRACT

A flat surface of a semiconductor chip is soldered to a relatively larger flat surface of a heat sink by forming a plurality of closely spaced grooves in the flat surface of the heat sink, coating the flat surfaces of the chip and the heat sink with nickel, disposing solder between the coated surfaces of the chip and the heat sink, and heating the surfaces until the solder melts. The grooves in the heat sink prevent the entrapment of gas bubbles between the chip and the heat sink, thereby providing good thermal conductivity and a relatively low electrical resistance between the chip and the heat sink.

4 Claims, 4 Drawing Figures

SEMICONDUCTOR MOUNTING DEVICES MADE BY SOLDERING FLAT SURFACES TO EACH OTHER

This invention relates to a method of joining flat surfaces to each other and devices made thereby. More particularly, the invention relates to a method of joining a semiconductor chip to a heat sink and/or joining the heat sink to a header and to the devices made thereby. The novel method is particularly useful in the manufacture of semiconductor devices as, for example, in the assembly of power transistors.

In the manufacture of certain semiconductor devices, such as integrated circuits and power transistors, for example, wherein a circuit or a component of the device is on a chip of semiconductor material; it is often necessary to mount the chip on a heat sink to dissipate heat therefrom during the operation of the device. In soldering a flat surface of the chip to a flat surface of the heat sink, we have observed that gas bubbles are often entrapped between the soldered surfaces. These gas bubbles, voids, cause a poor thermal conductivity and a relatively high electrical resistance between the soldered surfaces, resulting in overheating and a premature failure of the device. Also, some of the solder, initially between the flat surfaces, tends to ball up adjacent the periphery of the chip during the soldering operation. This condition sometimes results in an electrical short circuit between a component on the chip and the heat sink, and the device must be discarded.

In accordance with the novel method, means are provided to join one flat surface to another in a manner to obviate, or markedly reduce, the aforementioned disadvantages of the prior-art soldering methods.

Briefly stated, the novel method of joining two flat surfaces to each other comprises the steps of forming a plurality of grooves in one of the surfaces, applying a fusible bonding material between the surfaces, and heating the surfaces until the bonding material melts.

In a preferred embodiment of the novel method, a flat surface of a semiconductor chip is joined to a relatively larger, flat surface of a heat sink by pressing a plurality of closely spaced grooves into the heat sink, coating the flat surface of the chip first with nickel and then with a fusible bonding material, placing the flat surfaces together, and heating the chip and the heat sink until the bonding material melts. The semiconductor devices made by the novel method have improved heat dissipating and electrical conducting characteristics in comparison to devices of the prior art.

Figure 1:
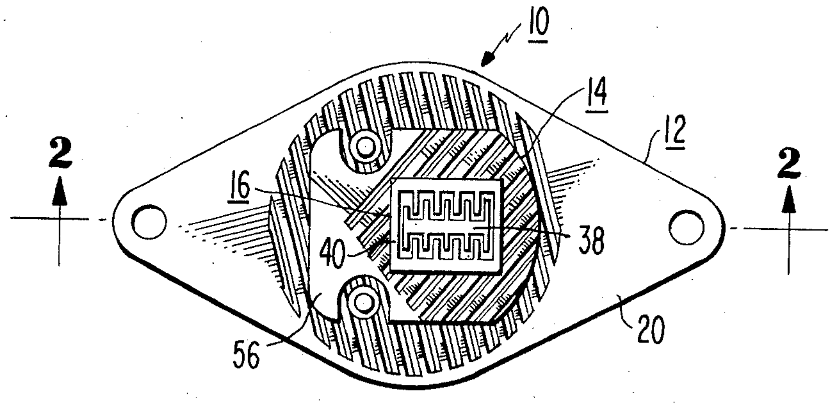
FIG. 1 is a plan view of a partially assembled power transistor, showing a heat sink joined to a grooved header, and a silicon chip joined to the grooved heat sink.
Figure 2:
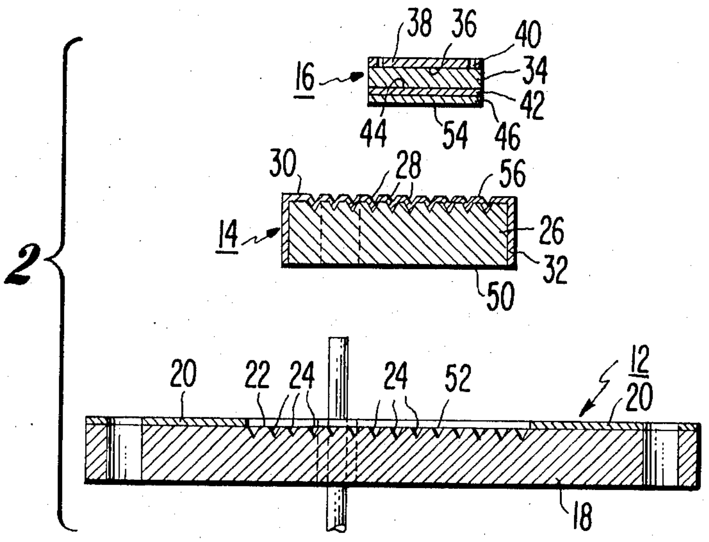
FIG. 2 is an exploded view of the power transistor, in cross section, taken along the line 2—2 in FIG. 1.

Referring now to FIGS. 1 and 2 of the drawing, there is shown a partially assembled power transistor device 10 comprising a header 12, a heat sink 14, and a semiconductor chip 16. The header 12 comprises a sheet 18 of cold-rolled steel, rhomboidal in shape, having a coating 20 (FIG. 2) of nickel on exposed portions of the device 10. In the manufacture of the device 10, the upper surface 22 of the sheet 18 of the header is formed with a plurality of substantially parallel grooves 24 (FIGS. 2 and 4), in a manner hereinafter to be described. Only those parts of the device 10 that relate to the novel method will be described herein.

The heat sink 14 comprises a relatively thick sheet 26 of copper having a plurality of substantially parallel grooves 28 on one (upper) surface 30. After the grooves 28 are formed in the surface 30, in a manner hereinafter to be described, the heat sink 14 is coated with a thin coating 32 of nickel. The coating 32 of nickel may be applied by electroless plating and subsequently sintered.

The transistor chip 16 comprises a sheet 34 which is a portion of a silicon wafer. The (upper) surface 36 of the sheet 34 has base and emitter regions diffused therein, in a manner well known in the semiconductor art, and emitter and base electrodes, 38 and 40, deposited over the emitter and base regions, respectively. A coating 42 of nickel, is deposited on the (lower) flat surface 44 of the sheet 34, as by electroless plating and sintering, and a coating 46 of a fusible bonding material, such as solder (5 percent tin and 95 percent lead), for example, is deposited on the coating 42. The coating 46 of solder may be applied to the coating 42 of nickel by dipping the sheet 34 in molten solder.

In accordance with the novel method, the lower surface 50 of the heat sink 14 is joined to the upper surface 22 of the header, and the lower surface 54 of the chip 16 is joined to the upper surface 56 of the heat sink. Means are provided to prevent gas bubbles, or voids, between the joined surfaces, whereby to prevent poor heat conductivity and a relatively high electrical resistance between the joined surfaces. To this end, the larger of the two surfaces to be joined to each other (with a fusible bonding material) is formed with a plurality of substantially parallel grooves, i.e., grooves like the grooves 24 and 28 described above.

Figure 4:
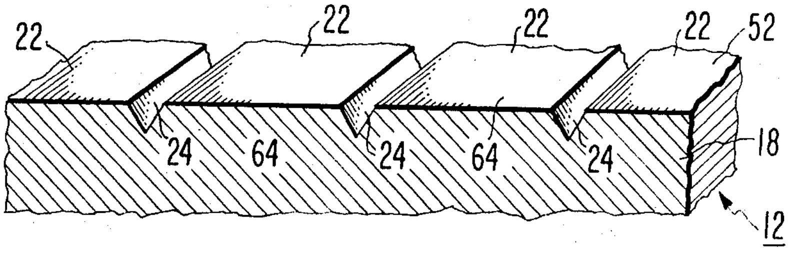
FIG. 4 is a fragmentary, enlarged, view of a portion of the heat sink (or header) shown in FIGS. 1 and 2, illustrating the grooves formed therein by the grooving tool shown in FIG. 3.

Referring now to FIG. 4 of the drawing, there is shown a portion of the header 12, illustrating the grooves 24 formed in the upper surface 22 of the sheet 18. The grooves 24 are between 1 and 3 mils (0.025–0.075 mm) in depth and between about 25 and 100 grooves per inch (per 2.54 cm). The grooves 24 are preferably V-shaped, spaced between about 10 and 40 mils apart from each other, and each groove 24 defines an angle of between 30° and 90°, preferably 60°, at its vertex.

Figure 3:
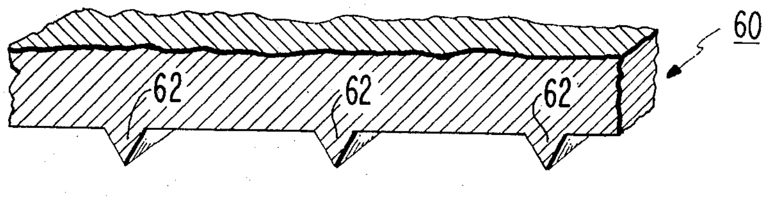
FIG. 3 is a fragmentary, enlarged, perspective view of a grooving tool used to form grooves in flat surfaces in accordance with the novel method.

The grooves 24 are preferably pressed into the upper surface 22 of the sheet 18 by means of a grooving tool 60, a portion of which is shown in FIG. 3. The grooving tool 60 is a die of hardened steel formed with a plurality of substantially equally spaced ridges 62 of a complementary shape to that of the grooves 24 in the header 12. The grooving tool 60 is adapted to press the grooves 24 into the sheet 18 of cold-rolled steel under high pressure as in a stamping press. The spaces 64 between the grooves 24 in the upper surface 52 of the header 12 should be substantially flat. The grooves 24 do not extend to the edges of the header 12 because a cap (not shown) is welded to the header to hermetically seal the chip 16 and heat sink 14.

It is within the contemplation of the present invention for the grooves, such as the grooves 24, to be other than V-shaped. Thus, for example, they may be U-shaped or even rectangular. The depth of the grooves, however, should be substantially as described for the grooves 24.

While the pressing, or punching of the grooved pattern in the header 12 is preferably done with a grooving tool, as explained supra, the grooves 24 may be formed by any other means known in the art. Thus, for example, the grooves 24 may be formed by coating the surface 22 with a coating, such as a wax or a resist, forming grooves in the coating and etching the grooves 24 with an etchant for the metal of the sheet 18. The grooves 24 should preferably be disposed on the larger of the two flat surfaces to be joined together.

In accordance with the novel method, the lower flat surface 50 of the heat sink 14 is joined to the upper grooved surface 52 of the header by placing a thin preform of a fusible bonding material, such as a silver-copper alloy (72 percent silver and 28 percent copper) of a size substantially equal to the lower surface 50 of the heat sink 14, between the heat sink 14 and the header 12. The assembly is then heated to a temperature of about 850°C until the preform melts. Any gases or bubbles that may form between the adjacent surfaces of the heat sink 14 and the header 12 are conducted through the grooves 24 beyond the periphery of the heat sink, thereby providing a braze between the flat surfaces that is substantially free of voids.

In accordance with the novel method, the lower surface 54 of the chip 16 is joined to the upper surface 56 of the heat sink by forming a plurality of grooves 28 in the upper surface 30 of the copper sheet 26 of the heat sink. The grooves 28 in the upper surface 30 of the copper sheet 26 of the heat sink 14 are formed with the grooving tool 60 in the same manner as described for forming the grooves 24 in the upper surface 22 of the sheet 18 of the header 12.

After the grooves 28 are formed in the upper surface 30 of the heat sink 14, the assembly of the heat sink 14 and the header 12, now called a stem, is coated with a coating of nickel (coating 20 on the header 12 and coating 32 on the heat sink 14) to prevent oxidation of the stem and to prevent copper from diffusing into the chip 16.

The chip 16 is joined to the heat sink 14 by placing its lower surface 54 against the grooved upper nickel coated surface 56 of the heat sink 14. The temperature of the surfaces 54 and 56 is then raised, as by placing the assembly of the stem and the chip 16 in a furnace, to about 400°C until the coating 46 of solder melts. Any gas bubbles, or voids, that may be formed during the heating operation are forced through the grooves, by capillary action, in the surface 56 of the heat sink 14 beyond the periphery of the chip 16, and substantially no solder tends to ball up along this periphery.

Power transistors having chips bonded to grooved heat sinks, in accordance with the novel method, carried more current, and had a lower thermal resistance than power transistors in which the chips were bonded to nongrooved heat sinks. It is also within the contemplation of the present invention for the grooves in a flat surface to comprise two or more sets wherein the grooves in one set cross the grooves in the other set.

What is claimed is:

1. In a semiconductor device wherein a first flat surface of a semiconductor chip is joined to a second flat surface of a metal by a fusible bonding material, the improvement comprising:

a plurality of non-intersecting grooves in said second flat surface adjacent said semiconductor chip and extending beyond the periphery thereof, said grooves being substantially parallel to each other, each of said grooves having a depth of between about 1 and 3 mils, and said grooves being spaced between about 10 and 40 mils from each other.

2. A semiconductor device as described in claim 1 wherein:

each of said grooves is substantially V-shaped and defines an angle of between 30° and 90° at its vertex.

3. A semiconductor device as described in claim 1 wherein:

said flat surface of said semiconductor chip has a coating of nickel thereon, said fusible bonding material comprises solder, said metal comprises a heat sink, and said heat sink has a coating of nickel thereon.

4. A semiconductor device as described in claim 3 wherein:

said device comprises, in addition, a header of metal having a flat surface formed with a plurality of grooves therein, and said heat sink has a lower flat surface bonded to the flat surface of said header with a fusible bonding material, said grooves in said header being adjacent said heat sink and extending beyond the periphery thereof.

* * * * *